United States Patent
Bae et al.

(10) Patent No.: US 7,518,213 B2
(45) Date of Patent: Apr. 14, 2009

(54) NONVOLATILE VARIABLE RESISTANCE MEMORY DEVICE AND METHOD OF FABRICATING THE SAME

(75) Inventors: Hyung-jin Bae, Yongin-si (KR); Jung-hyun Lee, Yongin-si (KR); Sang-jun Choi, Yongin-si (KR); Bum-seok Seo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 146 days.

(21) Appl. No.: 11/799,000

(22) Filed: May 18, 2007

(65) Prior Publication Data

US 2008/0002458 A1    Jan. 3, 2008

(30) Foreign Application Priority Data

Jun. 13, 2006   (KR) .................. 10-2006-0053139

(51) Int. Cl.
*H01L 29/00* (2006.01)

(52) U.S. Cl. ............... 257/537; 257/536; 257/E27.035; 365/148

(58) Field of Classification Search .......... 257/536, 257/537, E27.035; 365/148
See application file for complete search history.

(56) References Cited

U.S. PATENT DOCUMENTS

| | | | |
|---|---|---|---|
| 7,037,749 B2* | 5/2006 | Horii et al. | 438/95 |
| 2007/0252193 A1* | 11/2007 | Cho et al. | 257/315 |
| 2007/0295950 A1* | 12/2007 | Cho et al. | 257/4 |
| 2008/0169457 A1* | 7/2008 | Hideki et al. | 257/2 |
| 2008/0182357 A1* | 7/2008 | Campbell | 438/103 |
| 2008/0206920 A1* | 8/2008 | Campbell | 438/102 |
| 2008/0268565 A1* | 10/2008 | Lung | 438/96 |
| 2008/0272357 A1* | 11/2008 | Horii et al. | 257/3 |
| 2008/0272807 A1* | 11/2008 | Lowrey | 326/93 |
| 2008/0283815 A1* | 11/2008 | Nejad | 257/4 |

* cited by examiner

*Primary Examiner*—Ngan Ngo
(74) *Attorney, Agent, or Firm*—Harness, Dickey & Pierce, P.L.C.

(57) ABSTRACT

A nonvolatile variable resistance memory device may include a lower electrode; a stacked structure including a first Cu compound layer disposed on the lower electrode, and a second Cu compound layer disposed on the first Cu compound layer; and an upper electrode disposed on the second Cu compound layer.

18 Claims, 4 Drawing Sheets

NONVOLATILE VARIABLE RESISTANCE MEMORY DEVICE AND METHOD OF FABRICATING THE SAME

PRIORITY STATEMENT

This U.S. non-provisional application claims benefit of priority from Korean Patent Application No. 10-2006-0053139, filed on Jun. 13, 2006, in the Korean Intellectual Property Office (KIPO), the disclosure of which is incorporated herein in its entirety by reference.

BACKGROUND

1. Field

Example embodiments relate to a nonvolatile memory device and method of fabricating the same, for example, a nonvolatile variable resistance memory device that may achieve more stable bipolar switching characteristics by forming two or more continuous layers using $Cu_2O$ and a Cu compound.

2. Description of the Related Art

In order to achieve a smaller size and a larger data storage capacity, semiconductor memory devices may be required to have a larger number of memory cells per unit area, a higher integrity, a faster operating speed, and a lower driving power.

Conventional semiconductor memory devices may include numerous memory cells which may be connected through circuit boards. Dynamic Random Access Memories (DRAM's) are representative volatile semiconductor memory devices. DRAM's may include a unit memory cell that may include a single switch and a single capacitor. DRAM's may have advantages of higher integrity and faster operating speed, but may have a disadvantage in that the DRAM may lose all stored data if the power is turned off.

Nonvolatile memory devices may preserve stored data even if the power is turned off. Flash memories are representative nonvolatile memory devices. Flash memories may have nonvolatile characteristics, unlike volatile memories, but may have disadvantages of lower integrity and slower operating speed.

Examples of nonvolatile memory devices include Magnetic Random Access Memories (MRAM's), Ferroelectric Random Access Memories (FRAM's), Phase-change Random Access Memories (PRAM's), and Resistance Random Access Memories (RRAM's).

Among these nonvolatile memory devices, RRAM's may use voltage-dependent resistance characteristics (variable resistance characteristics) of transition metal oxide (TMO). RRAM devices using TMO may have switching characteristics that may be suitable for memory devices.

FIG. 1A illustrates a conventional RRAM device using a variable resistance material. Referring to FIG. 1A, a conventional RRAM device may include a lower electrode 10, an oxide layer 12, and an upper electrode 14 that may be sequentially stacked on a substrate (not shown). The lower electrode 10 and the upper electrode 14 may be formed of a conductive material. The oxide layer 12 may be formed of transition metal oxide having variable resistance characteristics. For example, the oxide layer 12 may be formed of $Cu_2O$, ZnO, $TiO_2$, $Nb_2O_5$, $ZrO_2$, CeO, VO, $V_2O_5$, $NiO_x$, or the like.

With respect to perovskite-RRAM's, perovskite oxide may be used as a variable resistance material. For example, perovskite oxide that may be used in formation of an oxide layer may include PCMO ($PrCaMnO_3$), Cr-STO ($SrTiO_3$), etc. Perovskite-RRAM's may achieve memory characteristics according to polarity applied to a memory node using the principle of the Schottky barrier deformation.

FIG. 1B is a graph illustrating the voltage-current characteristics of the variable resistance memory device of FIG. 1A in which the oxide layer 12 is made of $Cu_2O$. Referring to FIG. 1B, the variable resistance memory device using $Cu_2O$ may exhibit bipolar characteristics, but may have a larger current and voltage distribution and a higher current level at an "on" state.

SUMMARY

Example embodiments provide a nonvolatile memory device which may be more stably operated due to a narrower voltage and current distribution and may have improved switching characteristics due to a lower current level at an "on" state.

In an example embodiment, a nonvolatile variable resistance memory device may include a lower electrode; at least one coupled structure, including a first Cu compound layer disposed on the lower electrode, and a second Cu compound layer disposed on the first Cu compound layer; and an upper electrode disposed on the second Cu compound layer.

According to an example embodiment, the first Cu compound layer may be formed of $Cu_2O$.

According to an example embodiment, the second Cu compound layer may be formed of Cu and a Group 16 element.

According to an example embodiment, each of the upper electrode and the lower electrode may be formed of one of Pt, Ru, Ir, Au, Ag, and Ti.

According to an example embodiment, the at least one coupled structure may be at least two coupled structures stacked to form a multi-layered structure. The first Cu compound layers and the second Cu compound layers may be alternately stacked.

According to an example embodiment, a third Cu compound layer may be interposed between the second Cu compound layer and the upper electrode.

According to an example embodiment, the third Cu compound layer may be formed of Cu and a Group 16 element.

According to an example embodiment, one of a transistor structure and a diode structure may be electrically connected to the lower electrode.

According to an example embodiment, the transistor structure may include a substrate including a first impurity region and a second impurity region; a gate oxide layer disposed on the substrate and contacting with the first impurity region and the second impurity region; a gate electrode layer disposed on the gate oxide layer; and a contact plug interposed between the second impurity region and the lower electrode.

In an example embodiment, a method of fabricating a nonvolatile variable resistance memory device may include forming a lower electrode; forming at least one coupled structure, including forming a first Cu compound layer on the lower electrode, and forming a second Cu compound layer on the first Cu compound layer; and forming an upper electrode on the second Cu compound layer.

According to an example embodiment, the first Cu compound layer may be formed of $Cu_2O$.

According to an example embodiment, the second Cu compound layer may be formed of Cu and a Group 16 element.

According to an example embodiment, each of the upper electrode and the lower electrode may be formed of one of Pt, Ru, Ir, Au, Ag, and Ti.

According to an example embodiment, forming the at least one coupled structure may include stacking at least two coupled structures to form a multi-layered structure. The first Cu compound layers and the second Cu compound layers may be alternately stacked.

According to an example embodiment, the method may include forming a third Cu compound layer between the second Cu compound layer and the upper electrode.

According to an example embodiment, the third Cu compound layer may be formed of Cu and a Group 16 element.

According to an example embodiment, the method may include forming one of a transistor structure and a diode structure electrically connected to the lower electrode.

According to an example embodiment, forming the transistor structure may include providing a substrate including a first impurity region and a second impurity region; forming a gate oxide layer on the substrate and contacting with the first impurity region and the second impurity region; forming a gate electrode layer on the gate oxide layer; and forming a contact plug interposed between the second impurity region and the lower electrode.

BRIEF DESCRIPTION OF THE DRAWINGS

Example embodiments will be described with reference to the accompanying drawings.

DESCRIPTION OF EXAMPLE EMBODIMENTS

Figure 1A:
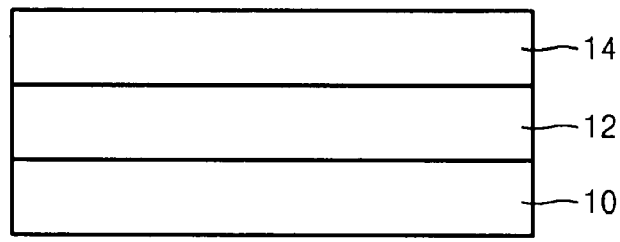
FIG. 1A is a sectional view of a conventional variable resistance memory device containing $Cu_2O$.

Example embodiments will now be described more fully with reference to the accompanying drawings. Example embodiments, however, may be embodied in many different forms and should not be construed as limited to the example embodiments set forth herein. Rather, the example embodiments are provided so that this disclosure will be thorough, and will convey the scope of the invention to those skilled in the art. In the drawings, the thicknesses and widths of layers and regions are exaggerated for clarity.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
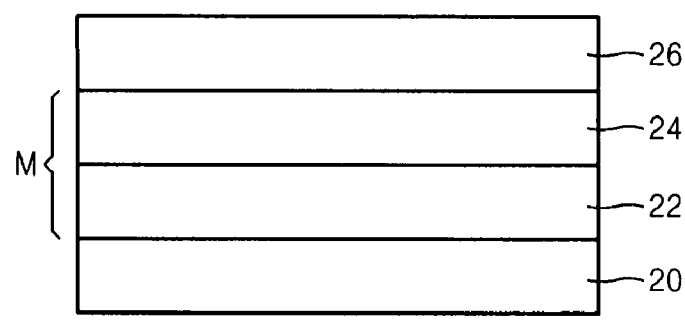
FIG. 2 is a sectional view of a nonvolatile variable resistance memory device containing $Cu_2O$, according to an example embodiment.

FIG. 2 is a sectional view of a nonvolatile variable resistance memory device containing $Cu_2O$ according to an example embodiment. Referring to FIG. 2, a lower electrode 20 may be formed on a substrate (not shown). A first Cu compound layer 22 may be formed on the lower electrode 20. A second Cu compound layer 24 may be formed on the first Cu compound layer 22. An upper electrode 26 may be formed on the second Cu compound layer.

The lower electrode 20 and the upper electrode 26 may be formed of a conductive material commonly used for electrodes of semiconductor memory devices, for example, Pt, Ru, Ir, Au, Ag, Ti, etc. The first Cu compound layer 22 may be formed of a Cu oxide, for example, $Cu_2O$ having bipolar characteristics.

Figure 5A:
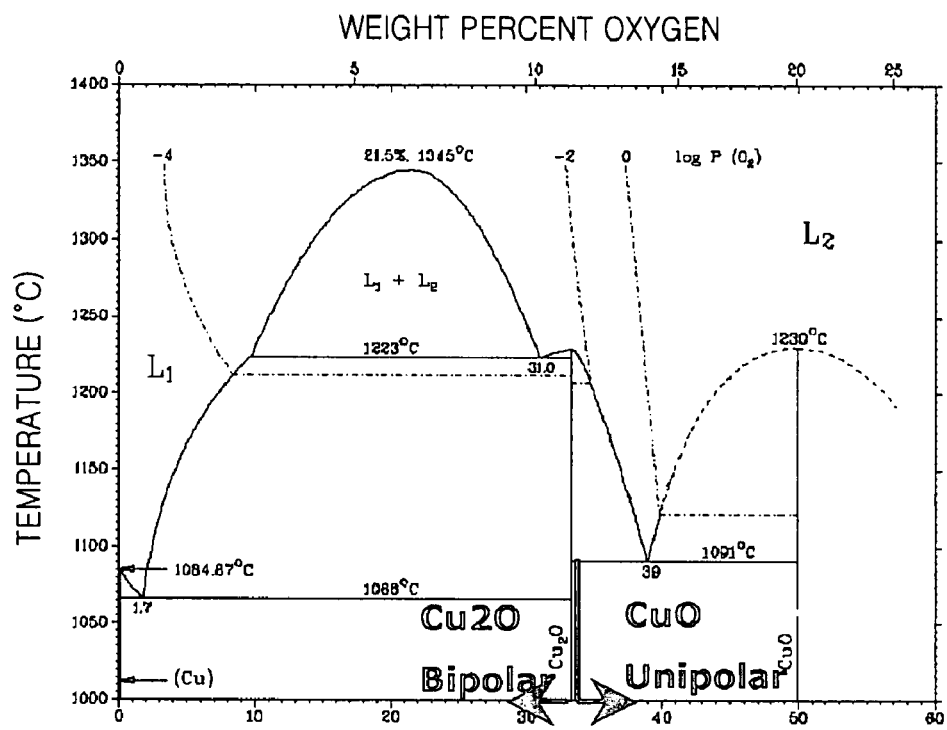
FIG. 5A is a diagram illustrating the behavior of phase transformation of a Cu—O compound according to the composition of the Cu—O compound.

FIG. 5A is a diagram illustrating the behavior of phase transformation of a Cu—O compound according to the composition of the Cu—O compound. Referring to FIG. 5A, the Cu—O compound may have bipolar characteristics at about 34 at % or less of O, and unipolar characteristics at about more than 34 at % of O.

Figure 5B:
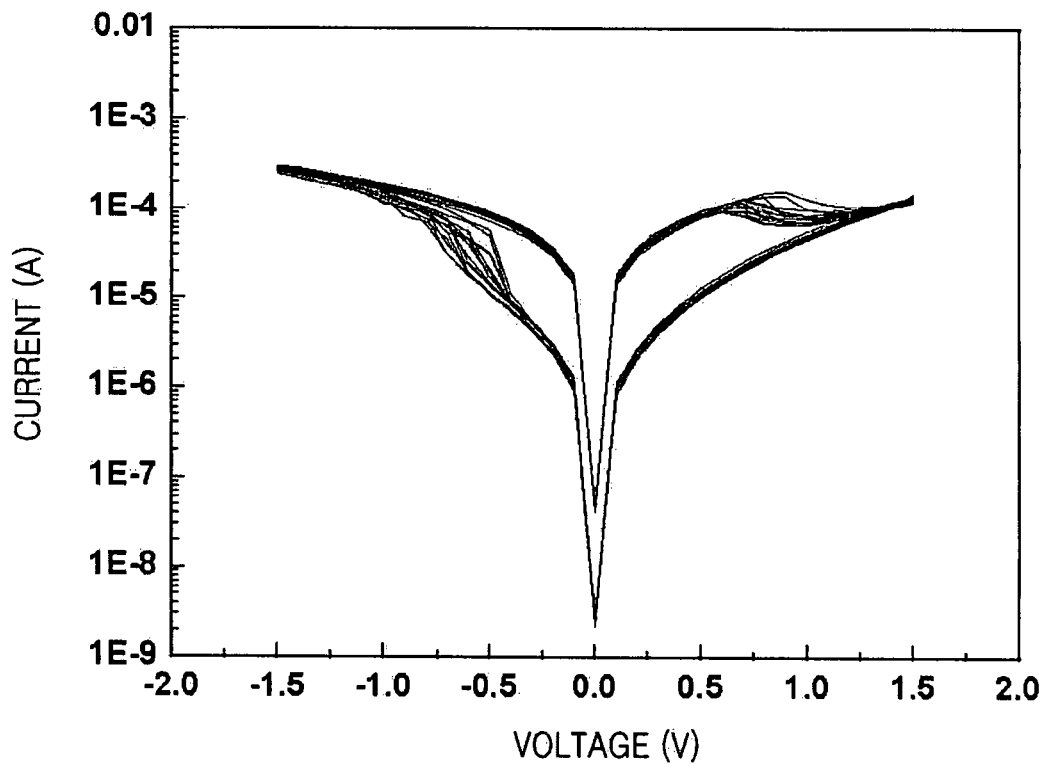
FIG. 5B is a graph illustrating bipolar characteristics of Cu oxide.

FIG. 5B is a graph illustrating voltage-current characteristics of a memory device having a sequentially stacked structure of a lower electrode, a $Cu_2O$ layer, and an upper electrode. Referring to FIG. 5B, the memory device may exhibit two resistance states at both plus (+) and minus (−) voltages. For example, if an applied voltage gradually decreases from an initial applied voltage of more than 2.0 V, a current change is observed along a lower current curve. On the other hand, if an applied voltage gradually increases from an initial applied voltage of less than −2.0 V, a current change is observed along a higher current curve. Based on these characteristics, the device of FIG. 5B may be used as a memory device.

Figure 5C:
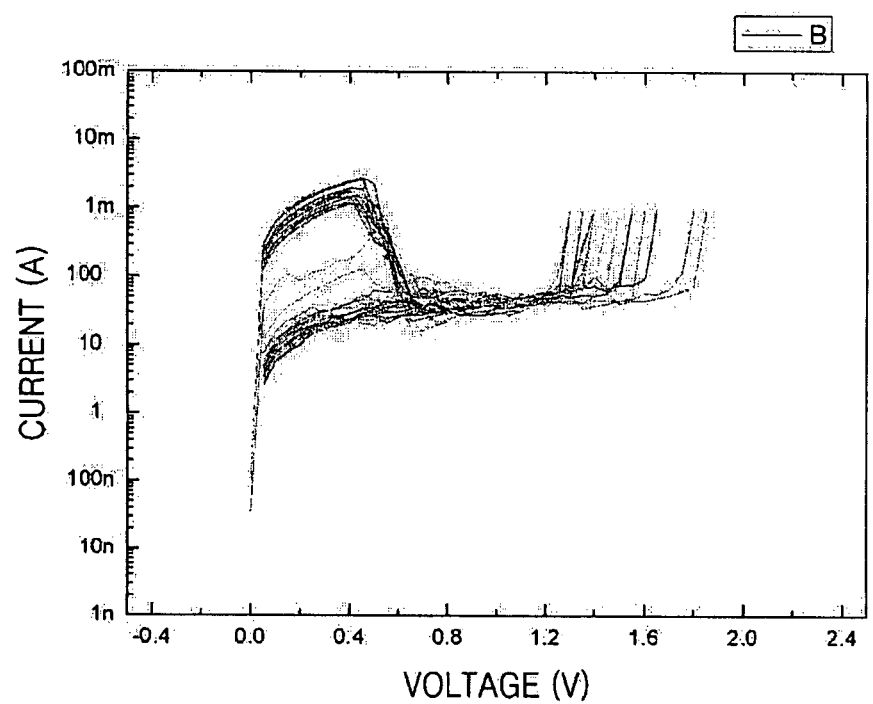
FIG. 5C is a graph illustrating unipolar characteristics of Cu oxide.

FIG. 5C is a graph illustrating voltage-current characteristics of a memory device having a sequentially stacked structure of a lower electrode, a CuO layer, and an upper electrode. Referring to FIG. 5C, the memory device may exhibit unipolar characteristics. Various resistance states are observed at an applied voltage of about 0.2 V. Thus, the resistance state of the memory device may be determined according to the applied voltage. For example, the memory device maintains a higher resistance state at an applied voltage of about 0.8V and a lower resistance state at an applied voltage of 2.0V or more. Based on these characteristics, the device of the FIG. 5C may be used as a memory device.

Referring again to FIG. 2, the first Cu compound layer 22 may be formed using $Cu_2O$. The second Cu compound layer 24 may be formed using a compound composed of Cu and a Group 16 element belonging to the oxygen (O) family. For example, the Group 16 element may be S, Se, or Te.

In a memory device according to an example embodiment, each layer may not be particularly limited to any thickness, and each layer may be formed in a shape commonly known in the art. Each layer may also be formed using a conventional semiconductor device fabrication process, for example, Physical Vapor Deposition (PVD) (e.g., sputtering) or Chemical Vapor Deposition (CVD).

Figure 3A:
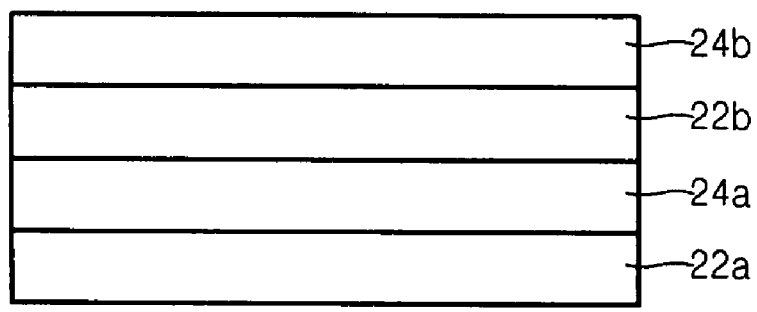
FIG. 3A is a sectional view of four Cu compound layers that may constitute an area M of FIG. 2.

FIG. 3A illustrates another example embodiment of a nonvolatile variable resistance memory device containing $Cu_2O$. An area M of FIG. 2 that may include a stacked structure of the first Cu compound layer 22 and the second Cu compound layer 24, may be defined as a "coupled structure." Referring to FIG. 3A, two or more coupled structures may be formed.

According to another example embodiment of the nonvolatile variable resistance memory device, a third Cu compound layer (not shown) may be formed between the second Cu compound layer 24 and the upper electrode 26. The third Cu compound layer may be formed of a compound composed of Cu and a Group 16 element.

Figure 3B:
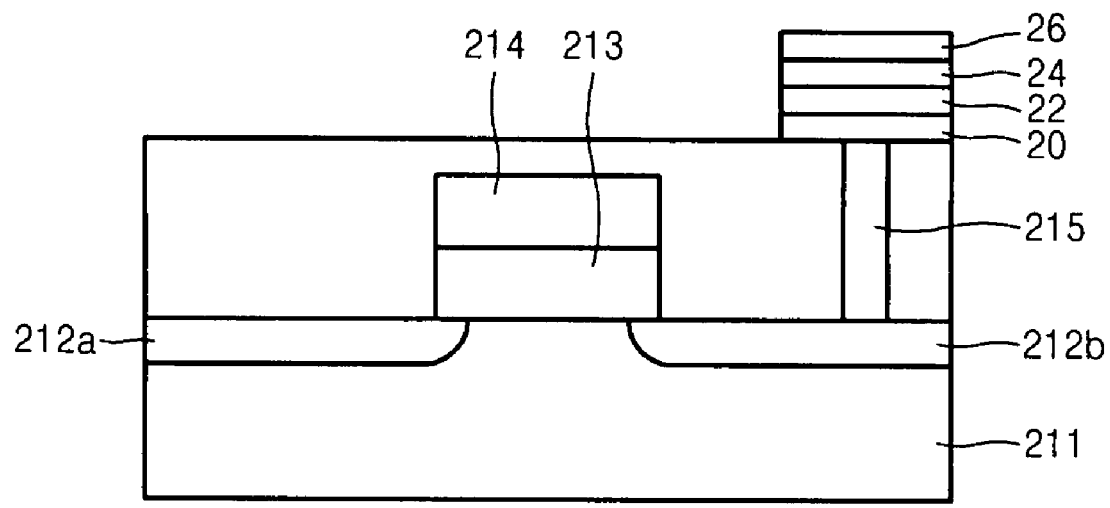
FIG. 3B is a sectional view of a combined structure of a transistor structure with a nonvolatile variable resistance memory device containing $Cu_2O$, according to an example embodiment.

FIG. 3B is a sectional view illustrating a 1T (transistor)-1R (resister) structure that may be formed, in which a nonvolatile variable resistance memory device containing $Cu_2O$, according to an example embodiment, may be connected to a transistor used as a switching device. Referring to FIG. 3B, a transistor structure may include a gate oxide layer 213 and a gate electrode layer 214. The gate oxide layer 213 of the transistor structure may be formed on a substrate 211 including a first impurity region 212a and a second impurity region 212b. The second impurity region 212b may be connected to a contact plug 215. A lower electrode 20, a first Cu compound layer 22, a second Cu compound layer 24, and an upper electrode 26 may be sequentially stacked on the contact plug 215.

According to another example embodiment, a 1D (diode)-1R (resistor) structure may be formed in which a nonvolatile variable resistance memory device containing $Cu_2O$, according to an example embodiment, may be connected to a diode structure including a p-type semiconductor layer and an n-type semiconductor layer, instead of a transistor structure.

Figure 4:
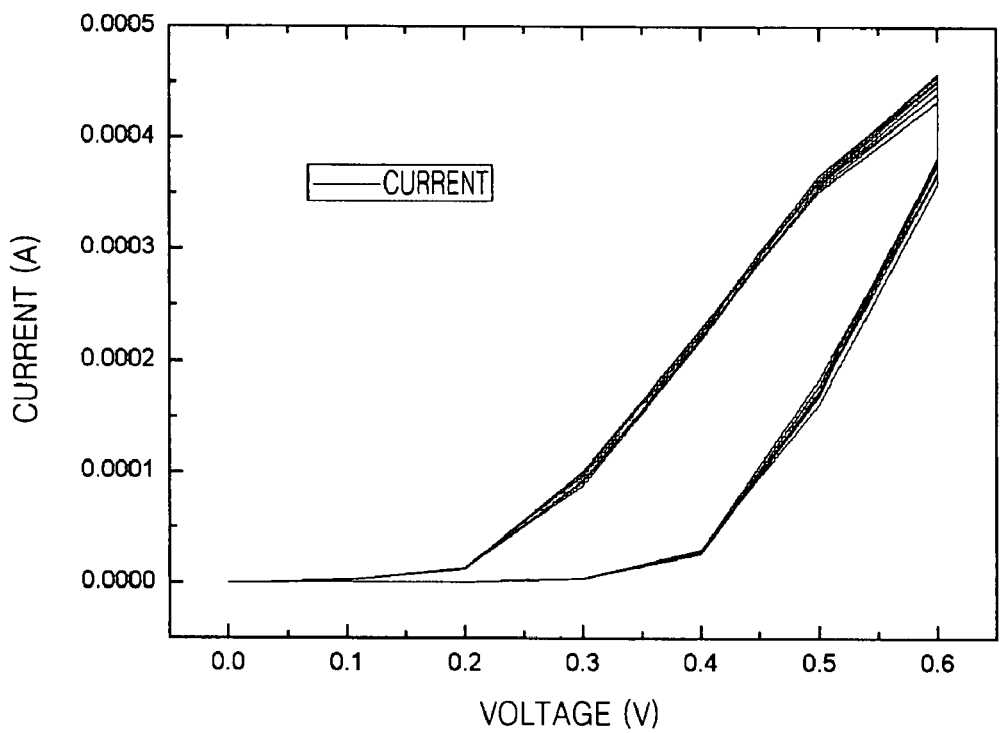
FIG. 4 is a graph illustrating voltage-current characteristics of a nonvolatile variable resistance memory device containing $Cu_2O$, according to an example embodiment.

FIG. 4 is a graph illustrating voltage-current characteristics of a nonvolatile variable resistance memory device containing $Cu_2O$, according to an example embodiment. A nonvolatile variable resistance memory device including a first Cu compound layer made of $Cu_2O$ and a second Cu compound layer made of $Cu_2S$ was used as a test sample. The first Cu compound layer and the second Cu compound layer were each formed to a thickness of about 80 nm or less.

Figure 1B:
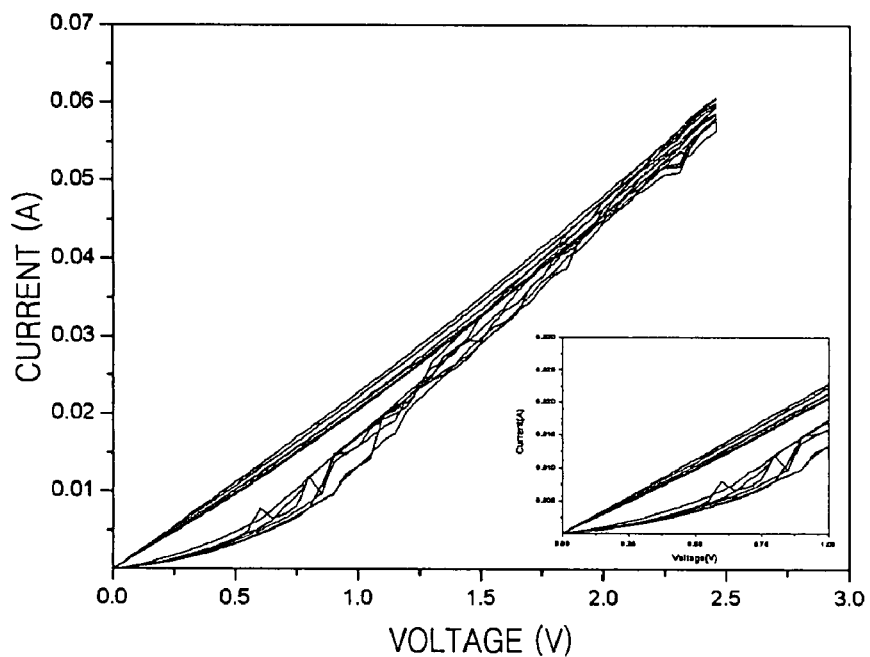
FIG. 1B is a graph illustrating voltage-current characteristics of the conventional variable resistance memory device of FIG. 1A.

Referring to FIG. 4, a nonvolatile variable resistance memory device containing $Cu_2O$ exhibits two resistance states according to a voltage applied between upper and lower electrodes. The memory device exhibits a single resistance state at an applied voltage of about 0.6V. In comparison between the voltage-current characteristics of the memory device of FIG. 4 and those of the conventional memory device of FIG. 1B, the memory device of FIG. 4 may exhibit a significant reduction in voltage-current distribution with respect to the number of voltage application, and a lower current level, relative to the memory device of FIG. 1B. These results show that a memory device according to an example embodiment may have more stable operating characteristics.

Example embodiments may provide a nonvolatile variable resistance memory device that may include a multi-layered structure of a $Cu_2O$ layer and a layer made of a compound composed of Cu and a Group 16 element, which may reduce a voltage-current distribution and a current level. The nonvolatile memory device may have more stable bipolar switching characteristics. Furthermore, the thickness of each layer of the nonvolatile memory device may be adjusted using a conventional semiconductor device fabrication process.

While example embodiments have been particularly shown and described, the example embodiments are for illustrative purposes only and are not intended to limit the scope. It will be understood by those of ordinary skill in the art that various changes in form and details may be made therein without departing from the spirit and scope as defined by the following claims.

What is claimed is:

1. A nonvolatile variable resistance memory device, comprising:
   a lower electrode;
   at least one coupled structure, including:
      a first Cu compound layer disposed on the lower electrode, and a second Cu compound layer disposed on the first Cu compound layer; and an upper electrode disposed on the second Cu compound layer.

2. The nonvolatile variable resistance memory device of claim 1, wherein the first Cu compound layer is formed of $Cu_2O$.

3. The nonvolatile variable resistance memory device of claim 1, wherein the second Cu compound layer is formed of a compound composed of Cu and a Group 16 element.

4. The nonvolatile variable resistance memory device of claim 1, wherein each of the upper electrode and the lower electrode are formed of one of Pt, Ru, Ir, Au, Ag, and Ti.

5. The nonvolatile variable resistance memory device of claim 1, wherein the at least one coupled structure is at least two coupled structures stacked in a multi-layered structure, and wherein first Cu compound layers and the second Cu compound layers are alternately stacked.

6. The nonvolatile variable resistance memory device of claim 1, further comprising a third Cu compound layer interposed between the second Cu compound layer and the upper electrode.

7. The nonvolatile variable resistance memory device of claim 6, wherein the third Cu compound layer is formed of Cu and a Group 16 element.

8. The nonvolatile variable resistance memory device of claim 1, further comprising one of a transistor structure and a diode structure electrically connected to the lower electrode.

9. The nonvolatile variable resistance memory device of claim 8, wherein the transistor structure comprises:

a substrate including a first impurity region and a second impurity region;

a gate oxide layer disposed on the substrate and contacting with the first impurity region and the second impurity region;

a gate electrode layer disposed on the gate oxide layer; and a contact plug interposed between the second impurity region and the lower electrode.

10. A method of fabricating a nonvolatile variable resistance memory device, comprising:

forming a lower electrode;

forming at least one coupled structure, including:

forming a first Cu compound layer on the lower electrode, and forming a second Cu compound layer on the first Cu compound layer; and forming an upper electrode on the second Cu compound layer.

11. The method of claim 10, wherein the first Cu compound layer is formed of $Cu_2O$.

12. The method of claim 10, wherein the second Cu compound layer is formed of Cu and a Group 16 element.

13. The method of claim 10, wherein each of the upper electrode and the lower electrode are formed of one of Pt, Ru, Ir, Au, Ag, and Ti.

14. The method of claim 10, wherein forming the at least one coupled structure includes stacking at least two coupled structures to form a multi-layered structure, and wherein first Cu compound layers and the second Cu compound layers are alternately stacked.

15. The method of claim 10, further comprising forming a third Cu compound layer between the second Cu compound layer and the upper electrode.

16. The method of claim 15, wherein the third Cu compound layer is formed of Cu and a Group 16 element.

17. The method of claim 10, further comprising forming one of a transistor structure and a diode structure electrically connected to the lower electrode.

18. The method of claim 17, wherein forming the transistor structure comprises:

providing a substrate including a first impurity region and a second impurity region;

forming a gate oxide layer on the substrate and contacting with the first impurity region and the second impurity region;

forming a gate electrode layer on the gate oxide layer; and forming a contact plug interposed between the second impurity region and the lower electrode.

* * * * *